(12) United States Patent
Opower et al.

(10) Patent No.: US 7,652,750 B2
(45) Date of Patent: Jan. 26, 2010

(54) LITHOGRAPHY EXPOSURE DEVICE HAVING A PLURALITY OF RADIATION SOURCES

(75) Inventors: Hans Opower, Krailling (DE); Stefan Scharl, Wasserburg (DE)

(73) Assignee: KLEO Halbleitertechnik GmbH & Co KG, Tettnang (DE)

( * ) Notice: Subject to any disclaimer, the term of this patent is extended or adjusted under 35 U.S.C. 154(b) by 0 days.

(21) Appl. No.: 11/392,970

(22) Filed: Mar. 28, 2006

(65) Prior Publication Data

US 2006/0170893 A1    Aug. 3, 2006

Related U.S. Application Data

(63) Continuation of application No. PCT/EP2004/010371, filed on Sep. 16, 2004.

(30) Foreign Application Priority Data

Sep. 29, 2003    (DE) ................... 103 46 201

(51) Int. Cl.
  *G03B 27/52* (2006.01)
(52) U.S. Cl. ........................................ 355/55
(58) Field of Classification Search ............. 355/55, 355/53, 70; 430/313, 290
  See application file for complete search history.

(56) References Cited

U.S. PATENT DOCUMENTS

| | | | |
|---|---|---|---|
| 6,274,288 B1 * | 8/2001 | Kewitsch et al. | 430/270.14 |
| 6,368,775 B1 | 4/2002 | Potter, Jr. et al. | |
| 6,692,894 B1 | 2/2004 | Nakano et al. | |
| 7,310,463 B2 * | 12/2007 | Shimotsuma et al. | 385/37 |
| 2001/0021484 A1 * | 9/2001 | Brauch et al. | 430/312 |

(Continued)

FOREIGN PATENT DOCUMENTS

EP    1 319 984    6/2003

(Continued)

OTHER PUBLICATIONS

Boisset, Buillaume. "Luxpop: Thin film and bulk index of refraction and photonics calculations." www.luxpop.com. Accessed Jan. 31, 2008.*

(Continued)

*Primary Examiner*—Peter B Kim
*Assistant Examiner*—Chia-how Michael Liu
(74) *Attorney, Agent, or Firm*—Lipsitz & McAllister, LLC

(57) ABSTRACT

A lithography exposure device is provided which includes a mounting device for the layer sensitive to light, an exposure unit with several laser radiation sources, an optical focusing means associated with the laser radiation sources, a movement unit for generating a relative movement between the optical focusing means and the mounting device, and a control for controlling intensity and position of exposure spots so that exposed structures which are as precisely structured as possible can be produced. A laser radiation field propagating in the direction of the light-sensitive layer generates each of the exposure spots from respective focal points and has a power density which leads in the conversion area in the light-sensitive layer to formation of a channel penetrating the light-sensitive layer with an index of refraction increased in relation to its surroundings by the Kerr effect and which guides the laser radiation field in a spatially limited manner.

14 Claims, 16 Drawing Sheets

U.S. PATENT DOCUMENTS

2002/0114567 A1 8/2002 Novotny et al.
2003/0162124 A1 8/2003 Akiba et al.

FOREIGN PATENT DOCUMENTS

WO 00/72092 11/2000

OTHER PUBLICATIONS

Kewitsch, Anthony S. and Yariv, Amnon (Jan. 22, 1996). "Nonlinear optical properties of photoresists for projection lithography." Applied Physics Letters, 68 (4). pp. 455-457.*

Rostami et al., "A Proposal for High Resolution Photolithography Using Optical Limiters", Laser Phys. Lett. 1, No. 9, pp. 462-467, 2004.

Patent Abstracts of Japan, vol. 2000, No. 20, Publication No. 2001066783, Material for Forming Fine Pattern, and Fine Pattern Forming Method Using the Same, Mar. 16, 2001.

Misawa, et al, "Microfabrication by Femtosecond Laser Irradiation", Proceedings of SPIE, vol. 3933, pp. 246-260 (2000).

Patent Abstracts of Japan, Publication No. 2001319382, "Exposure Device of Master Disk for Optical Recording Medium, Exposure Method of Master Disk for Optical Recording Medium, Optical Pickup and Optical Recording Method", Nov. 16, 2001.

* cited by examiner

US 7,652,750 B2

LITHOGRAPHY EXPOSURE DEVICE HAVING A PLURALITY OF RADIATION SOURCES

This application is a continuation of International application No. PCT/EP2004/010371 filed on Sep. 16, 2004.

The present disclosure relates to the subject matter disclosed in International application No. PCT/EP2004/010371 of Sep. 16, 2004 and German application No. 103 46 201.5 of Sep. 29, 2003, which are incorporated herein by reference in their entirety and for all purposes.

BACKGROUND OF THE INVENTION

The invention relates to a lithography exposure device for producing exposed structures extending in a surface area in a layer sensitive to light, comprising a mounting device for the light-sensitive layer, an exposure unit comprising several laser radiation sources, an optical focusing means associated with the laser radiation sources for the laser radiation exiting from the respective laser radiation sources, the optical focusing means generating from the laser radiation of each of the laser radiation sources an exposure spot effective in the light-sensitive layer with a predetermined extension transverse to a direction of exposure movement, a movement unit for generating a relative movement between the optical focusing means and the mounting device in the direction of exposure movement and a control for controlling intensity and position of the exposure spots relative to the light-sensitive layer in such a manner that a plurality of conversion areas penetrating the light-sensitive area can be generated by means of the exposure spots, the material of the light-sensitive layer being converted in these conversion areas from an initial state into an exposed state and the conversion areas together resulting in the exposed structure.

A lithography exposure device of this type is known from EP 1 319 984.

The object of lithography exposure devices is, however, always to configure the extension of the exposure spot as precisely as possible in order to be able to produce exposed structures which are structured as precisely as possible.

SUMMARY OF THE INVENTION

This object is accomplished in accordance with the invention, in a lithography exposure device of the type described at the outset, in that the optical focusing means has an end lens which generates focal points of the laser radiation exiting from each of the laser radiation sources close to the light-sensitive layer, that a laser radiation field propagates in the direction of the light-sensitive layer for generating each of the exposure spots from the respective focal points and has a power density which leads in the conversion area in the light-sensitive layer to the formation of a channel which penetrates the light-sensitive layer with an index of refraction increased in relation to its surroundings by the Kerr effect and guides the respective laser radiation field in a spatially limited manner.

The advantage of the solution according to the invention is, therefore, to be seen in the fact that as a result of the formation of the channel penetrating the light-sensitive layer in a direction of propagation, this formation being achieved on account of the Kerr effect, the extension of the laser radiation field transversely to the direction of propagation can be reduced, on the one hand, and, in addition, a considerable depth of focus in the exposed structure can be achieved due to the formation of the channel with an increased index of refraction and this leads to the exposed structure having very precise edges in relation to unexposed areas of the light-sensitive layer so that, on account of the high quality of the edges of the exposed areas, it is possible to produce exposed structures which have sharply defined contours and can, therefore, also be more finely structured than the structures which can be generated without such a formation of a channel with an increased index of refraction.

It is possible, in particular, with the solution according to the invention to obtain extensions of the exposure spots and the converted areas which are in the range of the wavelength or smaller than this.

A particularly advantageous solution provides for the power density of the laser radiation field in the conversion area of the light-sensitive layer to be in a range of approximately $10^6$ to approximately $10^8$ W/cm$^2$.

In order to achieve this high power density, the most varied of possibilities are conceivable. For example, it would be conceivable to use laser radiation sources having a very high power density.

A particularly simple solution provides for the respective laser radiation field to be formed by short pulses with excessive power.

The short pulses preferably have a pulse duration in the range of a few nanoseconds or are even shorter, preferably in the range of picoseconds or even shorter.

With respect to the increase in the index of refraction required for the advantageous formation of a channel in the light-sensitive layer, no further details have so far been given. One particularly favorable solution, for example, provides for the Kerr effect to lead in the channel to an increase in the index of refraction in relation to the surroundings in the light-sensitive layer by more than 0.1.

In the case of one advantageous embodiment, it is possible with the lithography exposure device according to the invention for the channel to have, transversely to the direction of propagation of the laser radiation, a cross sectional surface area which corresponds at the most to the extension of the corresponding focal point in the end surface.

With respect to the design of the end lens, no further details have been given in conjunction with the preceding explanations concerning the individual embodiments, expect for the fact that this generates the focal points arranged close to the light-sensitive layer from the laser radiation.

Precisely exposed structures may be produced particularly favorably with an advantageous lithography exposure device when, in addition or alternatively to the features of the lithography exposure device described above, the end lens generates the focal points close to or in its end surface facing the light-sensitive layer. In this case, focal points with a slight, spatial extension may be generated and the laser radiation field propagating from them likewise has a slight, spatial extension.

Furthermore, alternatively or in addition to the preceding embodiments, it is provided in a further, preferred lithography exposure device for the end surface of the end lens to be flat in an area penetrated by the laser radiation so that the focal points which are generated are likewise located in a plane preferably parallel to the surface of the light-sensitive layer.

An end lens, which is shaped in a similar manner to a hemisphere or a hyperhemisphere, has proven to be particularly suitable within the scope of the solution according to the invention since focal points which are particularly favorable and limited in a spatially narrow manner may be generated with such shapes of the end lenses.

With respect to the exact position of the focal points in the end lens, no further details have so far been given. The focal points could, for example, be located in an area bordering directly on the end surface but outside the solid-state body. One particularly favorable embodiment provides for the focal points to be located in the solid-state body of the end lens and in an area of the end lens bordering on its end surface, i.e., to border, in particular, directly on the end surface itself or be located in it.

In order to be able to utilize the limited extension of the field propagating from the respective focal point in an optimum manner it is provided for the end lens to be arranged with its end surface at a distance from the light-sensitive layer which is smaller than half the length of the light wave of the laser radiation in a vacuum.

The distance is preferably so slight that it amounts to less than approximately 50 nanometers.

The light-sensitive layer can, in principle, be any type of light-sensitive layer. One particularly advantageous solution provides for the light-sensitive layer to be a photosensitive coating layer.

Particularly fine, exposed structures may be generated with the solution according to the invention, in particular, when a diaphragm structure reducing the spatial extension of the exposure spots to dimensions in the range of the wavelength of the laser radiation or to smaller dimensions is associated with the end surface of the optical focusing means facing the light-sensitive layer.

Such a diaphragm structure is preferably built up such that this limits the laser radiation field in the direction of a component of its electric field.

Such a diaphragm structure preferably has at least one opening extending in a longitudinal direction over more than one wavelength of the laser radiation.

The opening preferably extends over a multiple of the wavelength of the laser radiation.

Furthermore, it is preferably provided for the opening to have longitudinal side edges which have a distance from one another of a wavelength of the laser radiation or less.

The distance between the longitudinal side edges is preferably, at the most, two thirds of a wavelength, even better at the most half the wavelength.

The lithography exposure device according to the invention is preferably designed such that with it each exposure spot is movable in a direction of deflection extending transversely to the direction of exposure movement. In this case, the diaphragm structure is preferably designed such that at least one of the openings of the diaphragm structure extends in the direction of deflection.

One particularly advantageous solution provides for the diaphragm structure to have an opening extending at least over an area of movement of the respective exposure spot in the direction of deflection.

In the simplest case, the electric field is aligned such that the laser radiation field can pass through the opening over the entire length of the opening.

Another advantageous solution provides for the diaphragm structure to have in the direction of deflection consecutive passage areas for the laser radiation field. This means that the laser radiation field does not have the possibility of passing through the diaphragm structure over the entire area of movement of the exposure spot in the direction of deflection but rather it is necessary for the laser radiation field to pass through the diaphragm structure only at specific, predetermined passage areas.

Such a solution has the advantage that with it the position of possible exposure spots may be determined solely by positioning the diaphragm structure relative to the light-sensitive layer and there is no necessity to determine the position of the exposure spot to be generated by switching the intensity of the laser radiation field on and off during the course of the movement of the exposure spot in the direction of the direction of deflection.

Such passage areas may be achieved particularly favorably in that they are formed by intersecting areas of two slit-shaped openings.

One possibility for realizing such a plurality of intersecting areas is for one of the slit-shaped openings to extend through the passage areas in the direction of deflection.

In this case, it would still be conceivable to limit the openings in their extension in the direction of deflection.

One particularly favorable solution provides for the slit-shaped opening extending in the direction of deflection to extend over the entire area of movement of the respective laser radiation field in the direction of deflection.

An alternative embodiment of a solution according to the invention provides for the openings to extend at an angle to the direction of deflection.

In this respect, two respective openings are preferably arranged such that they extend at an angle of 90° in relation to one another in order to achieve as high an intensity as possible of the laser radiation field passing through in the region of the passage area.

With respect to the alignment of the electric field of the laser radiation field of the respective laser radiation, it is preferably provided for the electric field of the respective laser radiation to extend transversely to the longitudinal direction of the respective openings, i.e., at an angle or at right angles thereto.

If only one opening is present, it is preferably provided for the electric field to extend at right angles to the longitudinal direction of the opening. If several openings are present, for example, those with intersecting areas intended to represent passage areas, it is preferably provided for the electric field to be inclined as far as possible at the same angle in relation to the longitudinal direction of both openings.

Since the longitudinal directions of two openings are preferably at an angle of approximately 90° in relation to one another in the region of the intersecting areas, it is preferably provided, in this case, for the electric field to be aligned such that it extends at an angle of approximately 45° in relation to the longitudinal direction of each of the openings.

In conjunction with the preceding explanations concerning a diaphragm structure provided, it has not been explained in detail where the diaphragm structure to be associated with the optical focusing means is to be arranged.

One advantageous embodiment provides for the diaphragm structure to be arranged directly on an end surface of the end lens.

Another possibility provides for the diaphragm structure to be arranged on a carrier which abuts, for its part, on the end surface of the end lens.

In this respect, the carrier is preferably arranged on the end surface of the end lens with a side located opposite the diaphragm structure.

In order to avoid reflections during the transition between the end lens and the carrier, it is preferably provided for the carrier to be connected to the end surface of the end lens in a manner adapted with respect to the index of refraction.

Such a connection adapted with respect to the index of refraction may be realized, for example, in that the carrier is connected to the end surface of the end lens free from adhesive.

One possibility for an adhesive-free connection provides for the carrier to be connected to the end surface of the end lens by way of bonding.

Another adhesive-free connection provides for the carrier to be connected to the end surface of the end lens by blowing them together.

Finally, it is, however, also conceivable to connect the carrier to the end lens by means of an adhesive adapted with respect to the index of refraction.

With respect to the design of the diaphragm structure, no further details have so far been given. The diaphragm structure may be formed by any type of diaphragm material which is suitable for partially suppressing the laser radiation.

One particularly advantageous solution provides for the diaphragm structure to be formed by a metal layer which may be applied to a surface and structured very easily.

Additional features and advantages of the invention are the subject matter of the following description as well as the drawings illustrating several embodiments.

DETAILED DESCRIPTION OF THE INVENTION

Figure 1:
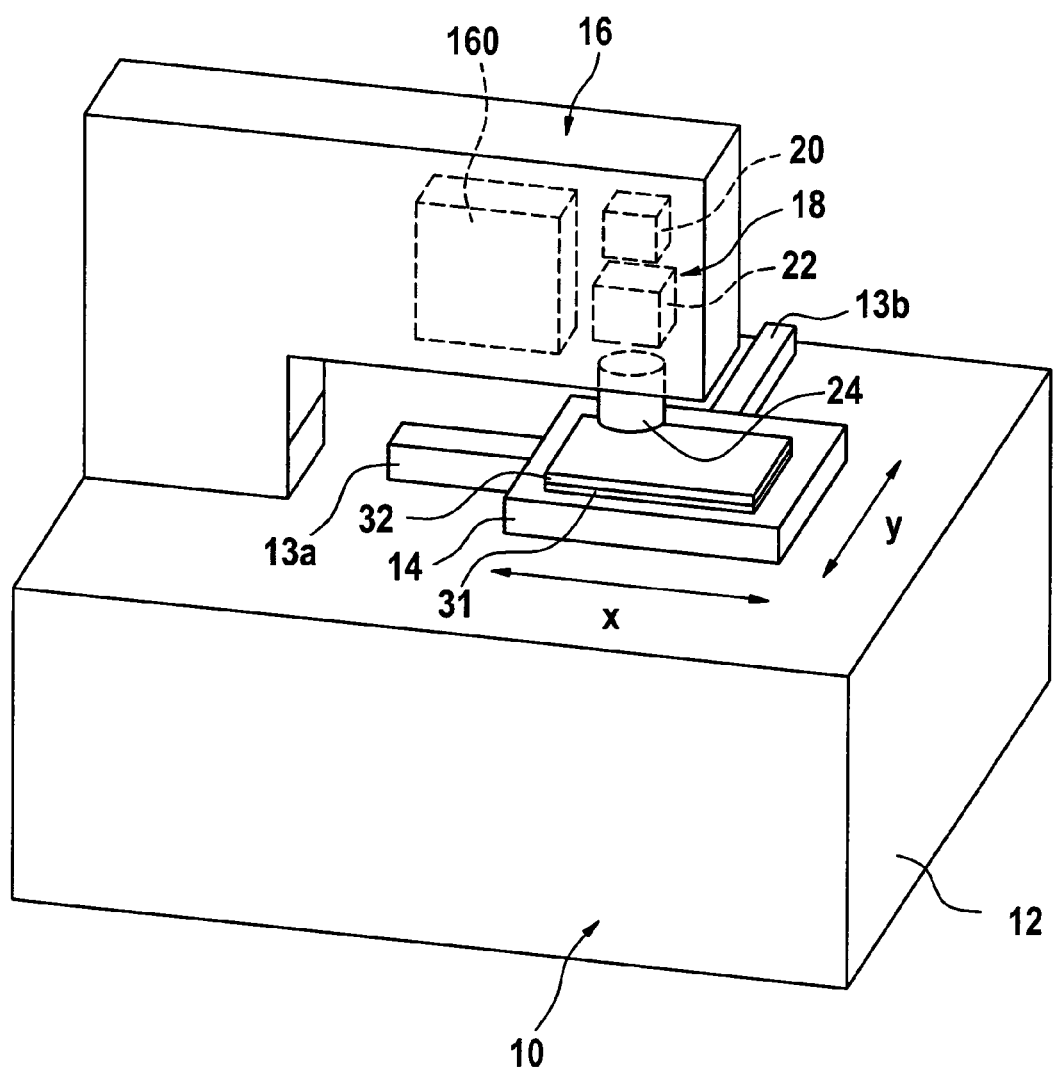
FIG. 1 shows a fundamental, schematic construction of a lithography exposure device according to the invention.

One embodiment of a lithography exposure device according to the invention, illustrated in FIG. 1, comprises a machine frame designated as a whole as 10 with a base member 12, on which a table 14 is mounted for movement in two directions extending at right angles to one another, for example, an X direction and a Y direction by means of drives 13a, b.

Figure 2:
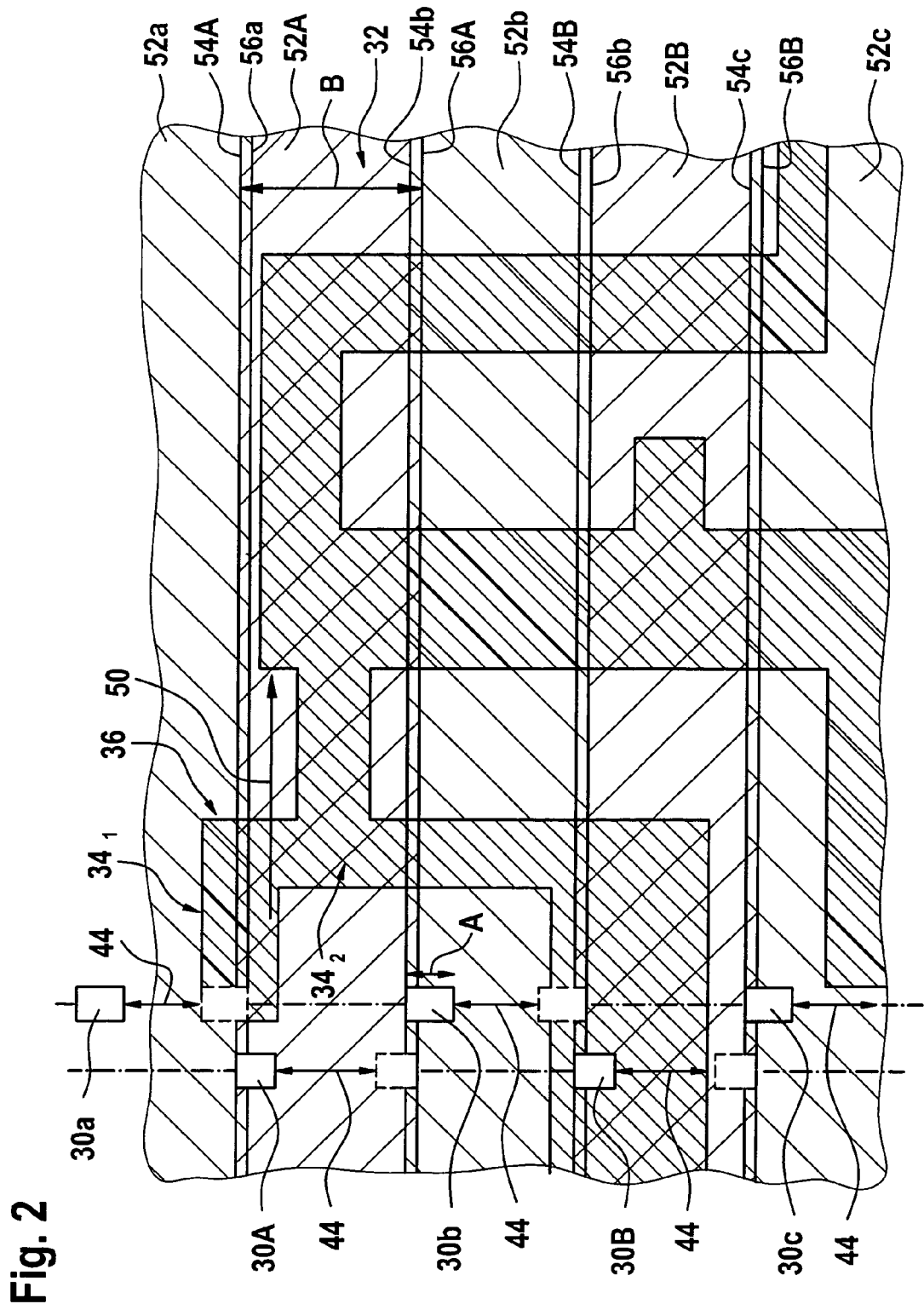
FIG. 2 shows a schematic illustration of exposed structures which can be produced with the lithography exposure device according to the invention and the image spots used for this purpose.
Figure 3:
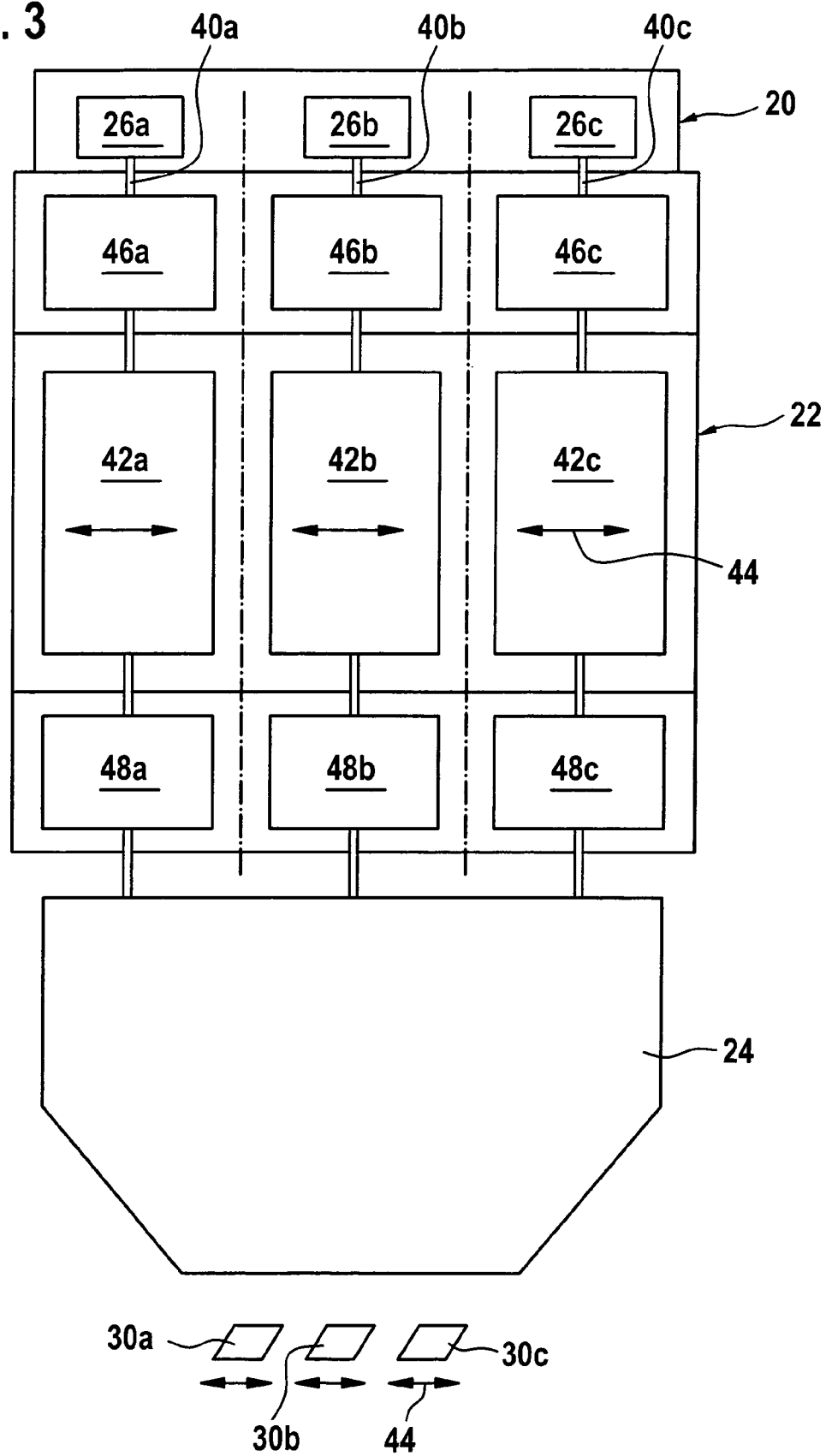
FIG. 3 shows a schematic illustration of the construction of a lithography exposure device according to the invention summarized in blocks.

An overhanging arm 16 extending over the table 14 and at a distance from it rises above the base member 12, an exposure unit 18, which has a plurality of laser radiation sources 26 combined in a radiation source unit 20, being arranged in this overhanging arm, as illustrated schematically in FIG. 1. A deflection device designated as a whole as 22 adjoins this radiation source unit 20 and this is followed by an optical focusing means which is designated as a whole as 24 and, in the end, images the laser radiation of each laser radiation source 26 as an exposure spot 30 onto a light-sensitive layer 32, normally a photosensitive coasting layer, which is arranged on the table 14 and applied to a carrier 31 in order to generate in the light-sensitive layer 32 conversion areas 34, in which the light-sensitive layer 32 is converted from an initial state into an end state and which result altogether in an exposed structure 36 (FIGS. 2, 3). The deflection device 22 and the optical focusing means 24 are also part of the exposure unit 18.

Alternatively to the movement of the table 14 in X and Y directions relative to an exposure unit 18 arranged so as to be stationary on the base member 12, it is provided in a different embodiment of the solution according to the invention, for example, for the table 14 or the exposure unit 18 to be moved only in X direction relative to the base member 12 and, however, for the exposure unit 18 or the table 14 to also be moved in contrast in Y direction relative to the base member 12 or for only the exposure unit 18 to be moved in X and Y directions and with the table 14 stationary on the base member 12.

As illustrated again in FIG. 3 in detail but still schematically, the radiation source unit 20 comprises a plurality of laser radiation sources 26 which can, for example, be semiconductor diode lasers or semiconductor lasers with an associated, light-linear, optical frequency conversion, i.e., frequency doubling in order to generate laser radiation with as short a wavelength as possible, preferably in the blue or ultrasonic spectral range.

The laser radiation 40 generated by the individual laser radiation sources 26 is supplied to the deflection device designated as a whole as 22 in the form of impulse propagation or via light guides.

The deflection device 22 comprises for the laser radiation 40 of each of the respective laser radiation sources 26 a deflection unit 42, with which the laser radiation 40 can be deflected in a direction of deflection 44, as will be described in the following in detail.

A beam shaping unit 46 is also provided between each of the laser radiation sources 26 and the corresponding deflection units 42.

Furthermore, a beam shaping unit 48 is likewise provided between each of the deflection units 42 and the optical focusing means 24 and this unit serves, for example, to generate bundles of laser radiation which are approximately rotationally symmetric prior to their entry into the optical focusing means 24.

For its part, the optical focusing means 24 generates the individual image spots 30 associated with each of the laser radiation sources 26 in the light-sensitive layer 32.

As illustrated in FIG. 2, during the exposure of the light-sensitive layer 32 the table 14 with the light-sensitive layer 32 arranged on it is moved in a direction of exposure movement 50 which can coincide, for example, with the X direction or the Y direction or can also result due to addition of a movement in X and Y directions.

Furthermore, the direction of exposure movement 50 always extends such that the directions of deflection 44, in which the laser radiation can be deflected, extend transversely to the direction of exposure movement 50, wherein a course at right angles is not absolutely necessary but rather a slightly inclined position is likewise possible.

As a result of the deflection of the laser radiation 40 in the direction of the directions of deflection 44, the exposure spot 30 resulting from the respective laser radiation 40 is likewise displaceable on the light-sensitive layer 32 in the direction of deflection 44, namely between an extreme position illustrated by solid lines in FIG. 2 and an extreme position illustrated by dash-dot lines in FIG. 2, wherein both extreme positions determine a width B of strip areas 52, within which conversions areas 34 can be generated in the light-sensitive layer 32 with the respective exposure spot 30. The width B corresponds to a multiple of an extension A of the respective exposure spot 30 in the direction of deflection 44.

The strip areas 52 are either arranged such that their outer edges 54 and 56 overlap slightly in order to ensure that the conversion areas 34 generated by the exposure spot 30 associated with one of the strip areas 52 can be generated in an interconnected manner with the conversion areas 34 generated by the exposure spot 30 associated with the next closest strip area 52 or are arranged such that the strip areas 52 do not overlap.

In the case of any overlapping, the conversion area $34_1$ can be generated as a continuous conversion area, for example, with the exposure spot 30a in the dash-dot position adjoining directly on the edge 56a and the exposure spot 30A in its position adjoining directly on the edge 54A.

Furthermore, the conversion area $34_2$ can be generated as a continuous conversion area on account of the overlapping of the strip areas 52a, 52A, 52b and 52B, for example, both with the exposure spot 34a in a position adjoining the edge 56a, the exposure spots 30A and 30b in all the positions located between the edges 54A and 56A as well as 54b and 56b and the exposure spot 30B in its positions located over somewhat more than half the strip area 52B proceeding from the edge 54B.

Figure 4:
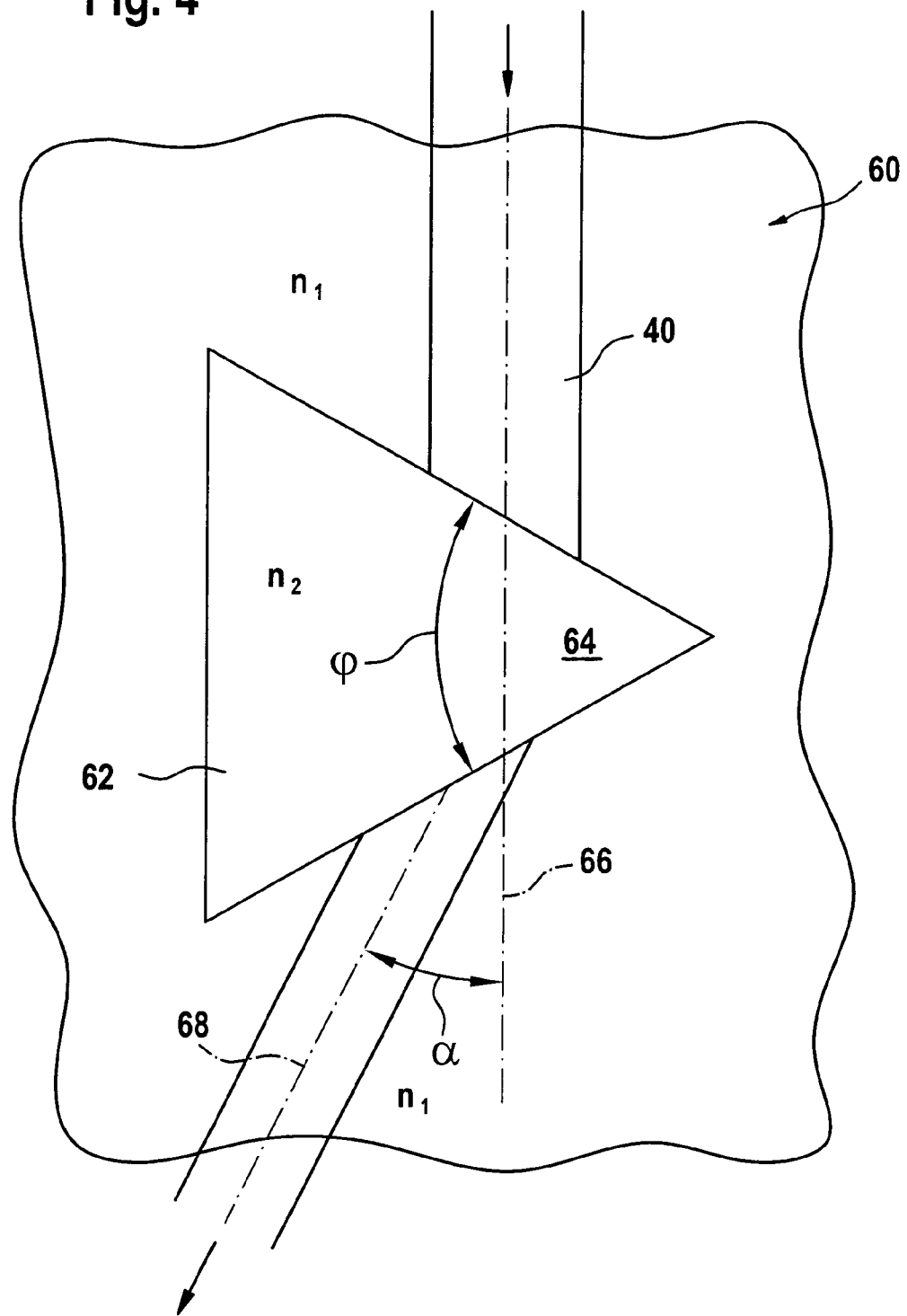
FIG. 4 shows a schematic illustration of a mode of operation of one embodiment of a deflection unit of a lithography exposure device according to the invention.

The individual deflection units 42 operate in the case of the lithography exposure device according to the invention in accordance with the following principle illustrated schematically in FIG. 4:

After passing through the beam shaping unit 46, which will be described in the following in detail, the laser radiation 40 coming from the respective laser radiation source 26 passes through a first medium 60 which has the index of refraction $n_1$. From the first medium 60, the laser radiation 40 passes into a beam-deflecting spatial area 62, which is designed, for example, as a prism or half a lens and within which a second medium 64 has a variable, adjustable index of refraction $n_2$ which is greater than $n_1$, and again passes into the first medium with the index of refraction $n_1$ after passing through the spatial area 62 (FIG. 4).

As a result, the laser radiation 40 is deflected by the spatial area 62, on account of the index of refraction $n_2$ of the second medium 64, from the original direction 66 into an exiting direction 68 which extends at an angle α in relation to the original direction and so a deflection of the laser radiation 40 by the spatial area 62 takes place.

The angle α thereby depends on the extent, to which the index of refraction $n_2$ of the second medium 64 differs from the index of refraction $n_1$ of the first medium 60, and so the angle α is also variable at the same time due to variation of the index of refraction $n_2$.

In the case of a spatial area 62 designed as a prism, α:α≈$(n_2-n_1)\phi$ applies approximately for small angles, wherein φ is the prism angle determining the prismatic spatial area 62.

Figure 5:
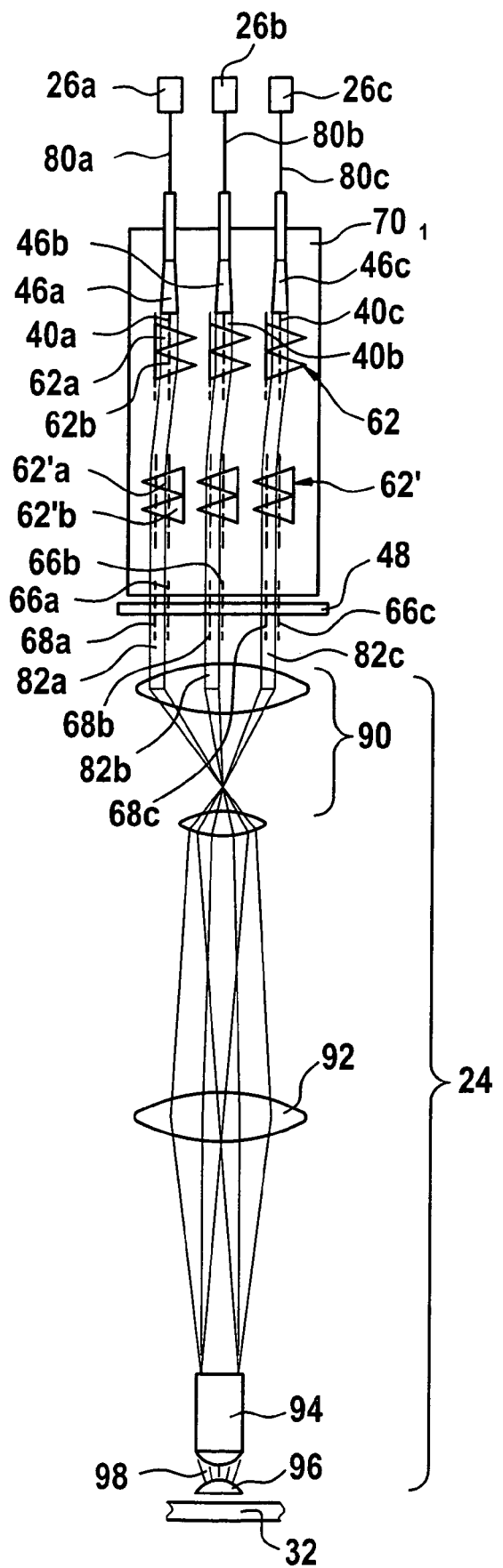
FIG. 5 shows a schematic sectional illustration of a first embodiment of an exposure unit according to the invention.

The effectiveness of the spatial area 62 may be increased further when, as illustrated in FIG. 5, several consecutive spatial areas 62a, 62b, each consisting of the second medium, are used and the laser radiation 40 passes through them one after the other so that the deflection generated by each individual one of the spatial areas 62a, 62b may be added together and the exiting direction 68 extends altogether at an angle α to the original direction 66 which represents the sum of the deflections achieved in each of the spatial areas.

Beam-deflecting spatial areas 62 of this type are described in detail in European patent application No. 02 027 118.5, to which reference is made in full.

Since the laser radiation 40 extends in the exiting direction 68 at an angle to the original direction 66 after passing through the prism areas 62a, 62b, spatial areas 62'a, 62'b having a complementary effect are preferably provided, in addition, in the first embodiment according to FIG. 5 and these spatial areas again deflect the laser radiation 40 through an angle α in the opposite direction so that, in the end, the exiting direction 68' extends parallel to the original direction 66 but offset in relation to it by a distance D after passing through the spatial areas 62a, 62b and the complementary spatial areas 62'a, 62'b.

As a result, the laser radiation 40 propagating in the exiting direction 68' can be imaged into the exposure spot 30 by the optical focusing means 24 without any additional measures on account of an inclined incidence.

In the embodiment illustrated in FIG. 5, only the elements located in the plane of drawing are illustrated on account of the type of illustration. For example, the laser radiation is generated by the laser radiation sources 26a, 26b and 26c and the laser radiation is guided to the waveguide plate $70_1$ via light guides 80a, 80b and 80c. The beam shaping units 46a, 46b and 46c for the laser radiation 40a, 40b, 40c from the individual laser radiation sources 26a, 26b and 26c, which broaden the laser radiation 40a, 40c and 40e to form a band broadening in the direction of deflection 44, are provided in this waveguide plate.

It is possible as a result of the prism units 62 and 62' to offset the laser radiation 40a, 40b and 40c in relation to the original direction 66a, 66b and 66c, for example, into the exiting directions 68a, 68b and 68c illustrated which need not be at the same distance from one another in the direction of deflection 44 but can be at different distances.

The beam shaping unit 48 forms the bundles of radiation 82a, 82b and 82c which then enter the optical focusing means designated as a whole as 24 from the laser radiations 40a, 40b and 40c.

The optical focusing means 24 has, for its part, an ocular 90, a tube lens 92 and an objective 94, wherein the ocular reduces the size, for example, ten times and the objective 94, for example, fifty times.

In this respect, the tube lens 92 is preferably arranged between the ocular 90 and the objective 94 such that the distance corresponds each time to the focal distance.

Figure 6:
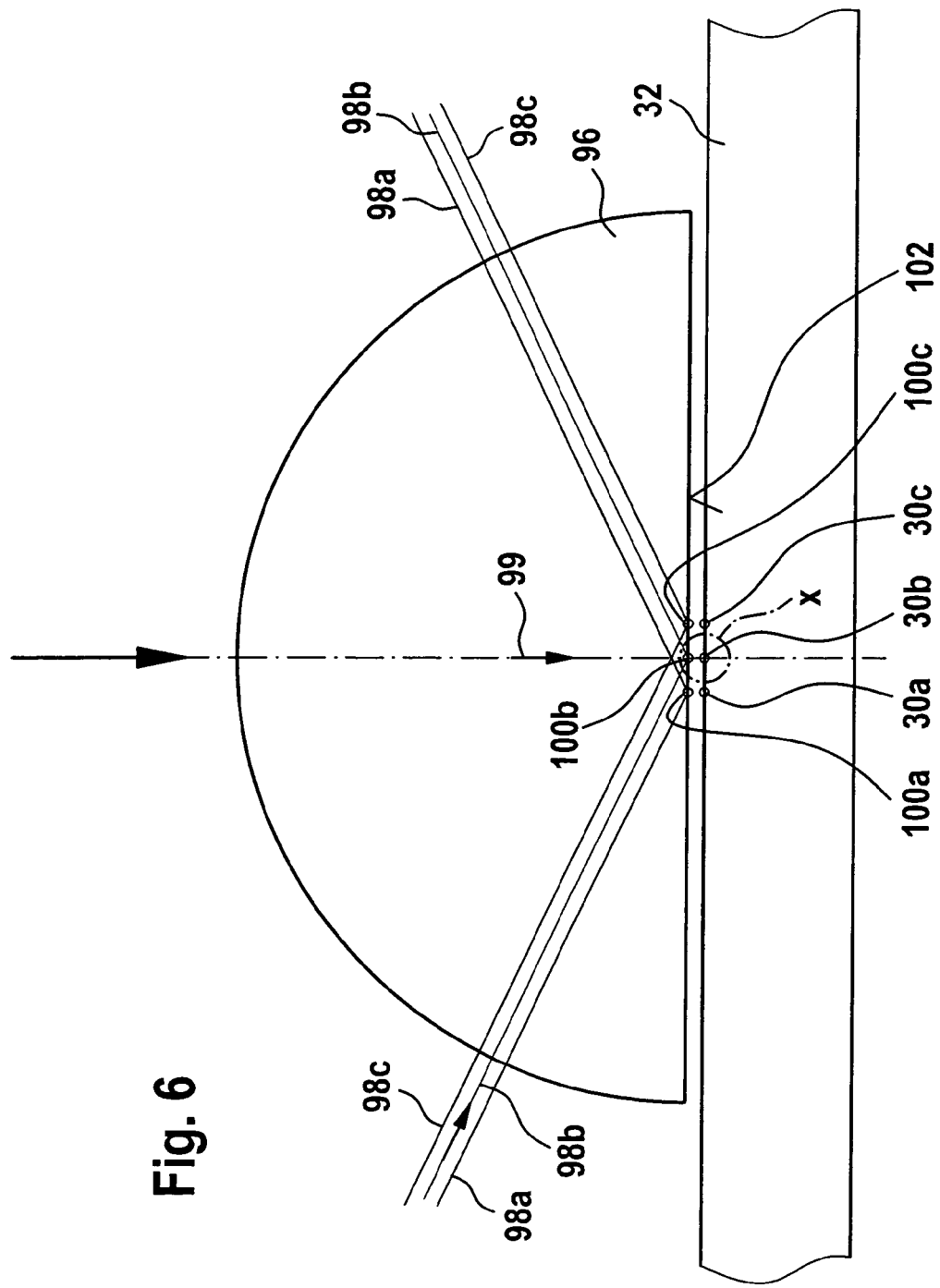
FIG. 6 shows a section through an end lens of the first embodiment according to FIG. 5.
Figure 7:
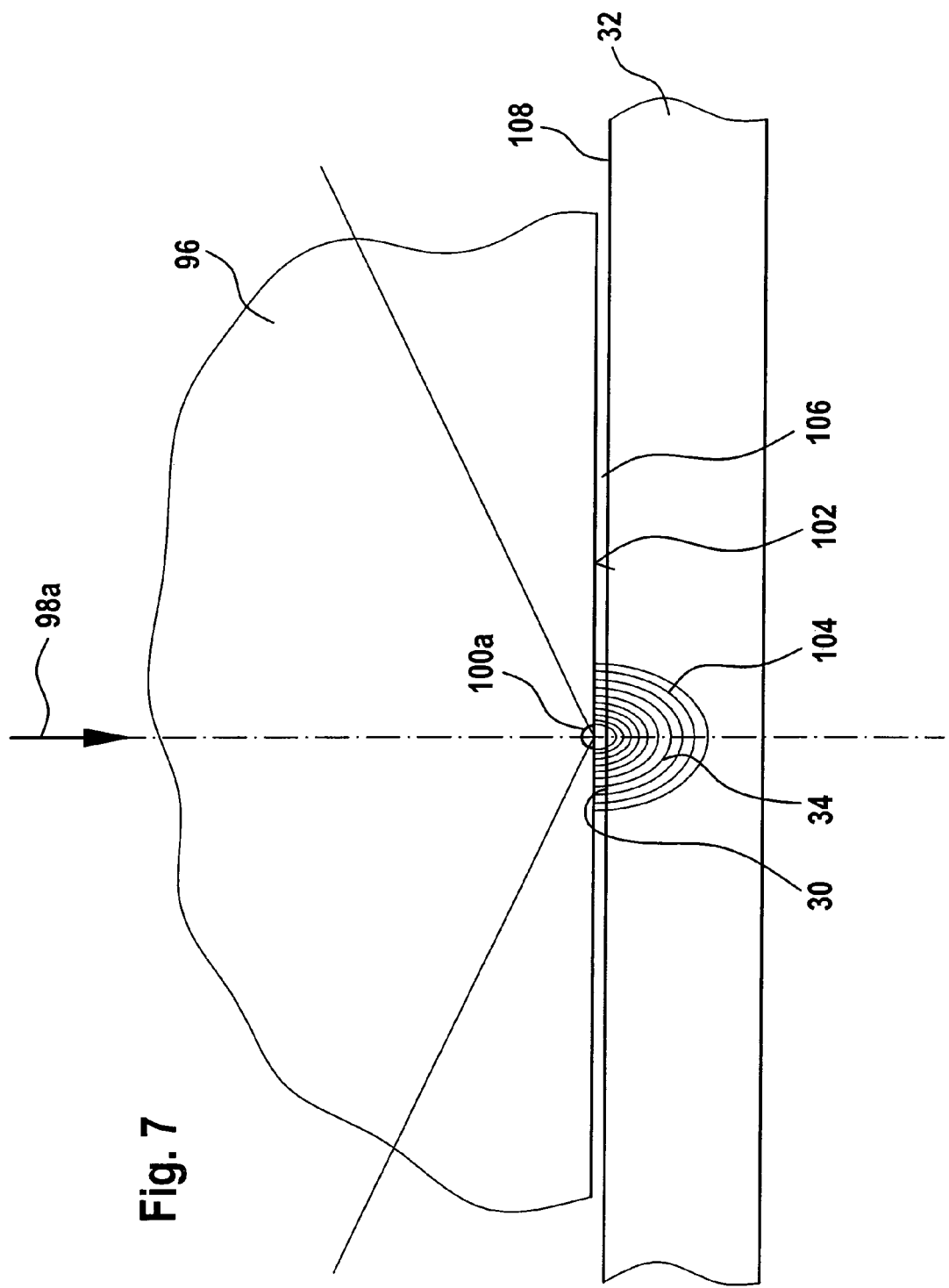
FIG. 7 shows a sectional, enlarged illustration of the area X in FIG. 6 with a low power density.

An end lens 96 of the optical focusing means 24 is arranged between the objective 94 and the light-sensitive layer 32 and this, as illustrated in FIG. 6, focuses the laser radiation 98 which exits from the objective 94 and is focused by this as well as corresponds each time to one of the bundles of radiation 82a, 82b or 82c, in FIG. 6, for example, the laser radiation 98a, 98b, 98c, onto a corresponding focal point 100a, 100b, 100c within the end lens 96 which borders each time directly on an end surface 102 of the end lens 96 facing the light-sensitive layer 32 so that a laser radiation field 104 propagates from the respective focal point 100, this field propagating into the light-sensitive layer 32 through a space 106 between the end surface 102 and the light-sensitive layer 32 which is, in particular, less than approximately 100 nm wide, preferably less than approximately 50 nm, even better in the order of magnitude of 10 nm (FIG. 7).

A laser radiation field 104 of this type propagates at a low power density in the light-sensitive layer 32 with an extension which is substantially greater than the focal point 100, from which the laser radiation field 104 proceeds, as illustrated in FIG. 7. In particular, an increasing penetration of the laser radiation field 104 into the light-sensitive layer 32 leads to an increasing enlargement of the conversion area 34 resulting thereby, in particular with a view to the extension of the exposure spot 30 generated thereby which is at its greatest directly on a surface 108 of the light-sensitive layer 32.

Figure 8:
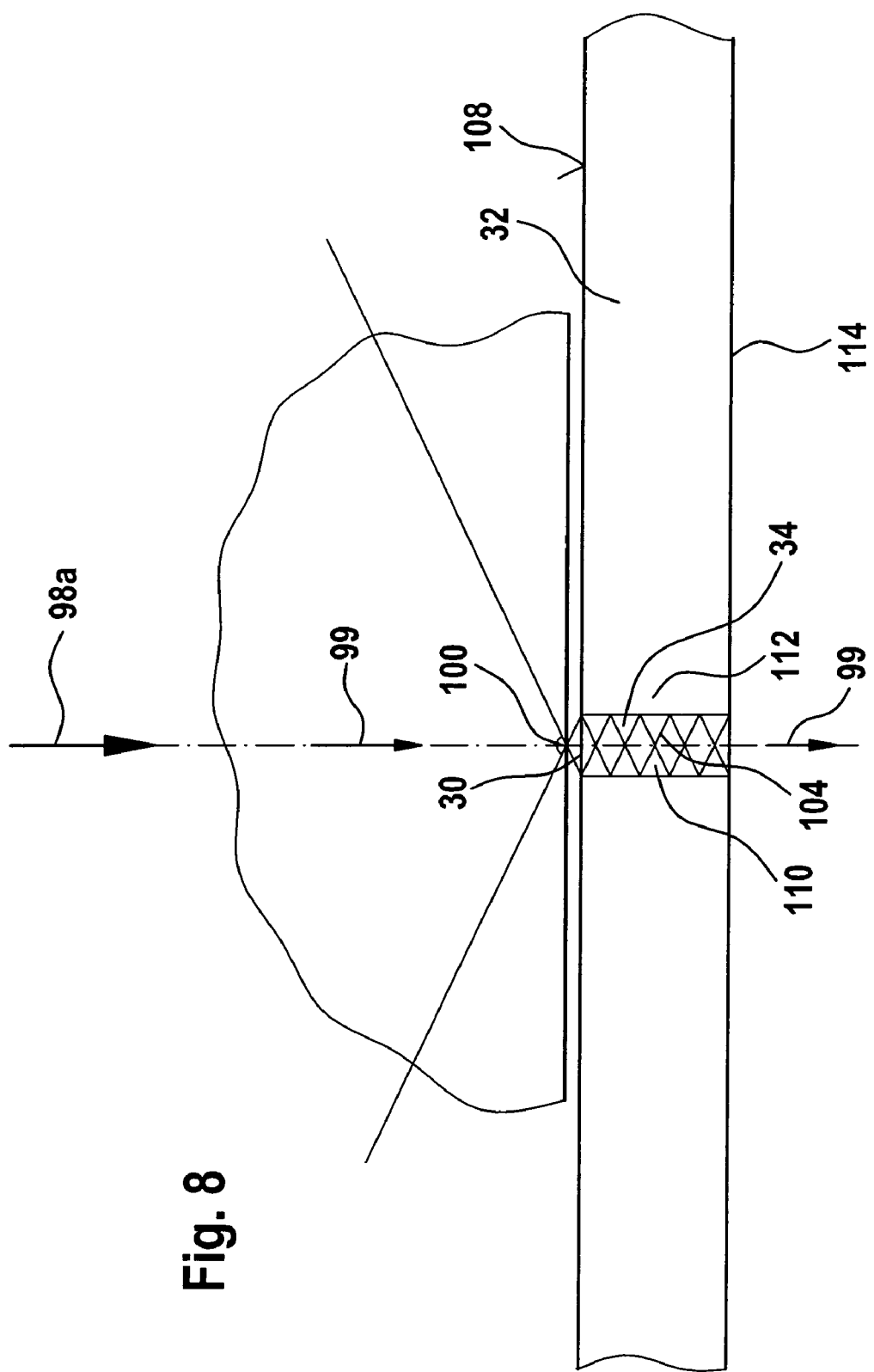
FIG. 8 shows a sectional illustration of the area X in FIG. 6 with a high power density of the laser radiation.

For this reason, as illustrated in FIG. 8, it is provided in the solution according to the invention for the power density of the laser radiation field 104 proceeding from each focal point 100 in the light-sensitive layer to be in the range of approximately $10^6$ to approximately $10^8$ W/cm$^2$ so that the index of refraction n increases by more than 0.1, preferably at least 0.2, within a channel 110 of the light-sensitive layer 32 as a result of the Kerr effect and a reflection of the laser radiation field 104 occurs on account of the index of refraction n increased within the channel 110 in the light-sensitive layer 32 in comparison with the surroundings 112 and, therefore, the laser radiation field 104 is guided within the channel 110 by way of reflection at the transition from the higher index of refraction to the lower index of refraction and, therefore, with an essentially constant cross section of the channel 110 away from the surface of the light-sensitive layer 32 enters this layer and passes through it preferably as far as a substrate 114 penetrating the light-sensitive layer 32.

The extension of the exposure spot 30 corresponds approximately to a cross-sectional area of the channel 110 formed in the light-sensitive layer 32 transverse to the direction of propagation 99 of the laser radiation 98.

As a result, the extension of the exposure spot 30 and of the conversion area 34 adjoining it is reduced transversely to the direction of propagation 99 of the laser radiation 98 on account of the Kerr effect.

A further reduction in the extension of the exposure spot 30 may be achieved by using a TM 00 mode for the laser radiation 98 and taking into consideration an alignment of the electric field E thereof determined by the polarization.

Figure 9:
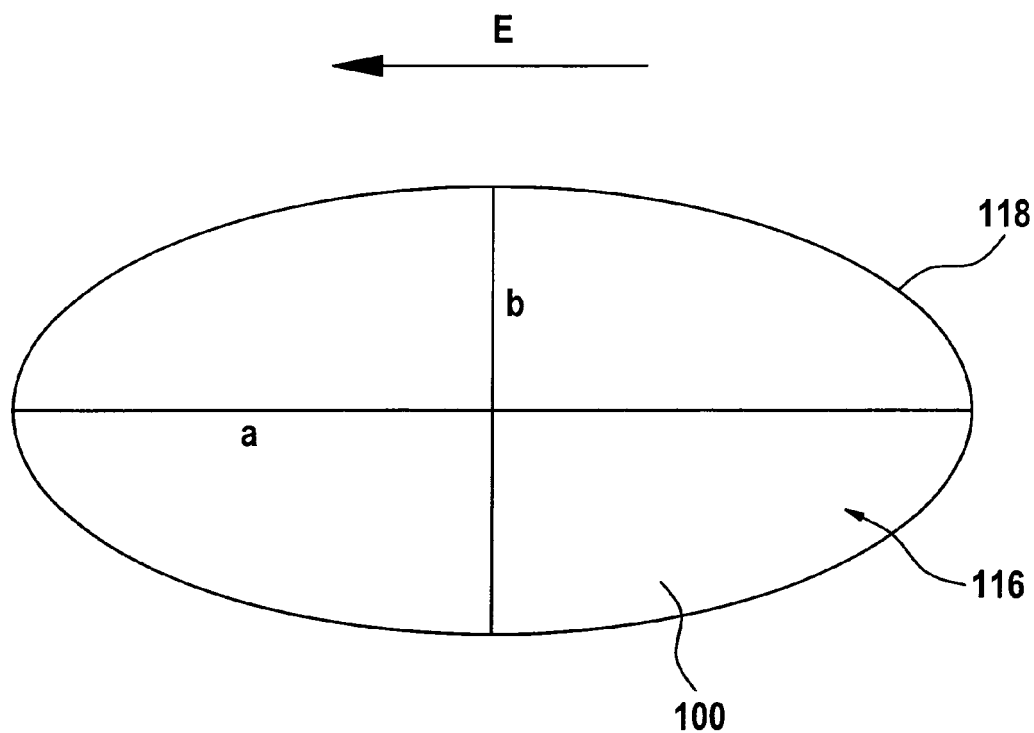
FIG. 9 shows a schematic illustration of a distribution of intensity in the focal point according to FIG. 6 in the first embodiment.

As illustrated in FIG. 9, the distribution of intensity 116 of the laser radiation 98 is asymmetric, preferably elliptical, in a plane at right angles to the direction of propagation 99 in the case of a TM 00 mode and, in the case of polarized laser radiation, has in a direction parallel to the electric field E a diameter a which is greater than a diameter b at right angles to the electric field E and so the distribution of intensity 116 is approximately elliptical, as illustrated in FIG. 9 by means of an elliptical outer contour 118.

The diameter a of the distribution of intensity 116 corresponds approximately to $$a = 0.6 \frac{\lambda}{NA},$$

i.e., it is dependent on the wavelength λ of the laser radiation 98 and the numerical aperture NA of the optical focusing means 24.

In order for the exposure spots 30 to have as slight an extension as possible in a plane extending transversely or at right angles to the direction of propagation 99, it is possible in a second embodiment of the solution according to the invention to limit the laser radiation field 104, which proceeds with the distribution of intensity 116 from the focal point 100, in its extension in the plane extending at right angles to the direction of propagation 99 by means of a diaphragm structure 120 to an extension which is less than the wavelength of the laser radiation 98 itself.

For example, the diaphragm structure 120 has an opening 122 which is elongated in a longitudinal direction 124 and the longitudinal edges 126a and 126b of which extending parallel to the longitudinal direction 124 have a distance Ab from one another which is smaller than the wavelength R, is preferably smaller than two thirds of the wavelength and, in particular, is in the order of magnitude of half a wavelength λ of the laser radiation 98.

Furthermore, the opening 122 is also limited by transverse side edges 128a and 128b which are arranged at a distance from one another in the longitudinal direction 124 and this distance is greater than the wavelength λ of the laser radiation 98, it preferably amounts to a multiple of the wavelength λ of the laser radiation 98.

If the diaphragm structure 120 is aligned such that the electric field E extends transversely to the longitudinal side edges 126a, 126b of the opening 122 and, therefore, transverse to the longitudinal direction 124 of the opening 122, the laser radiation field 104 passing through the opening 122 may be limited in a transverse direction 125 extending at right angles to the longitudinal direction 124, namely to an extension which corresponds approximately to the distance Ab between the longitudinal side edges 126a and 126b of the opening 122.

In the most advantageous case, the electric field E of the laser radiation field 104 is aligned such that this is at right angles to the longitudinal side edges 126a and 126b since, in such a case, the laser radiation field 104 propagating through the opening 122 has the maximum intensity.

Figure 10:
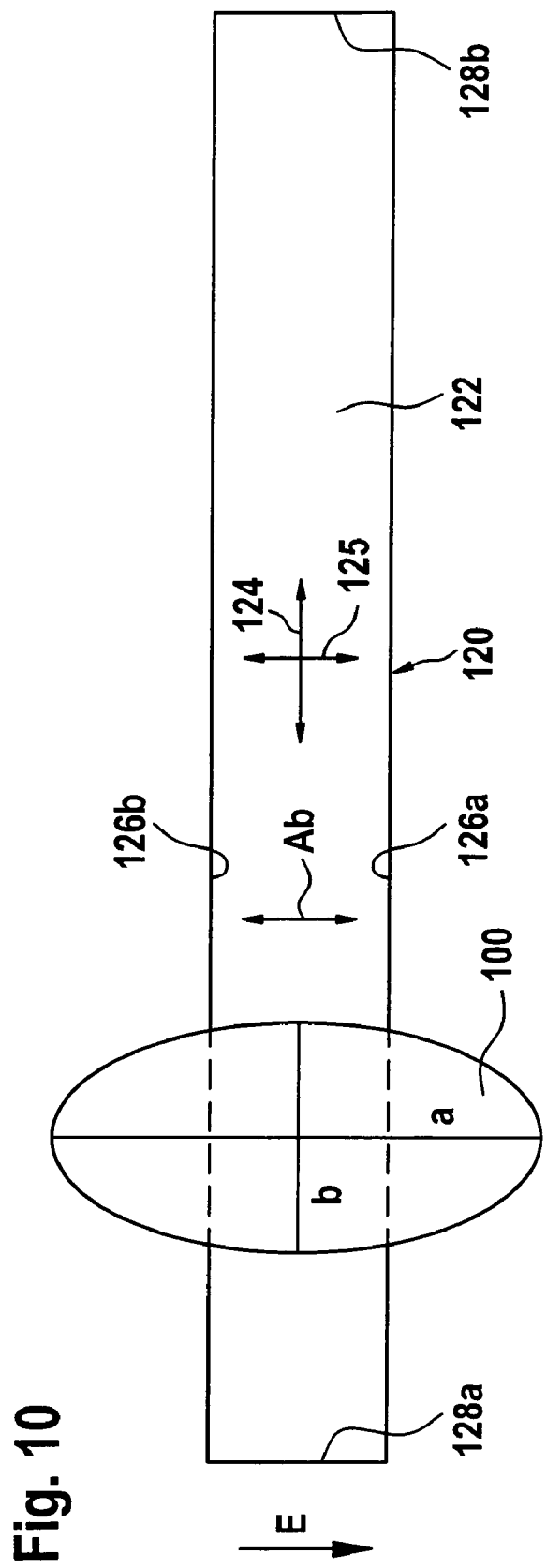
FIG. 10 shows a schematic illustration of a relative arrangement of focal point and diaphragm structure in a second embodiment of the exposure unit according to the invention.
Figure 11:
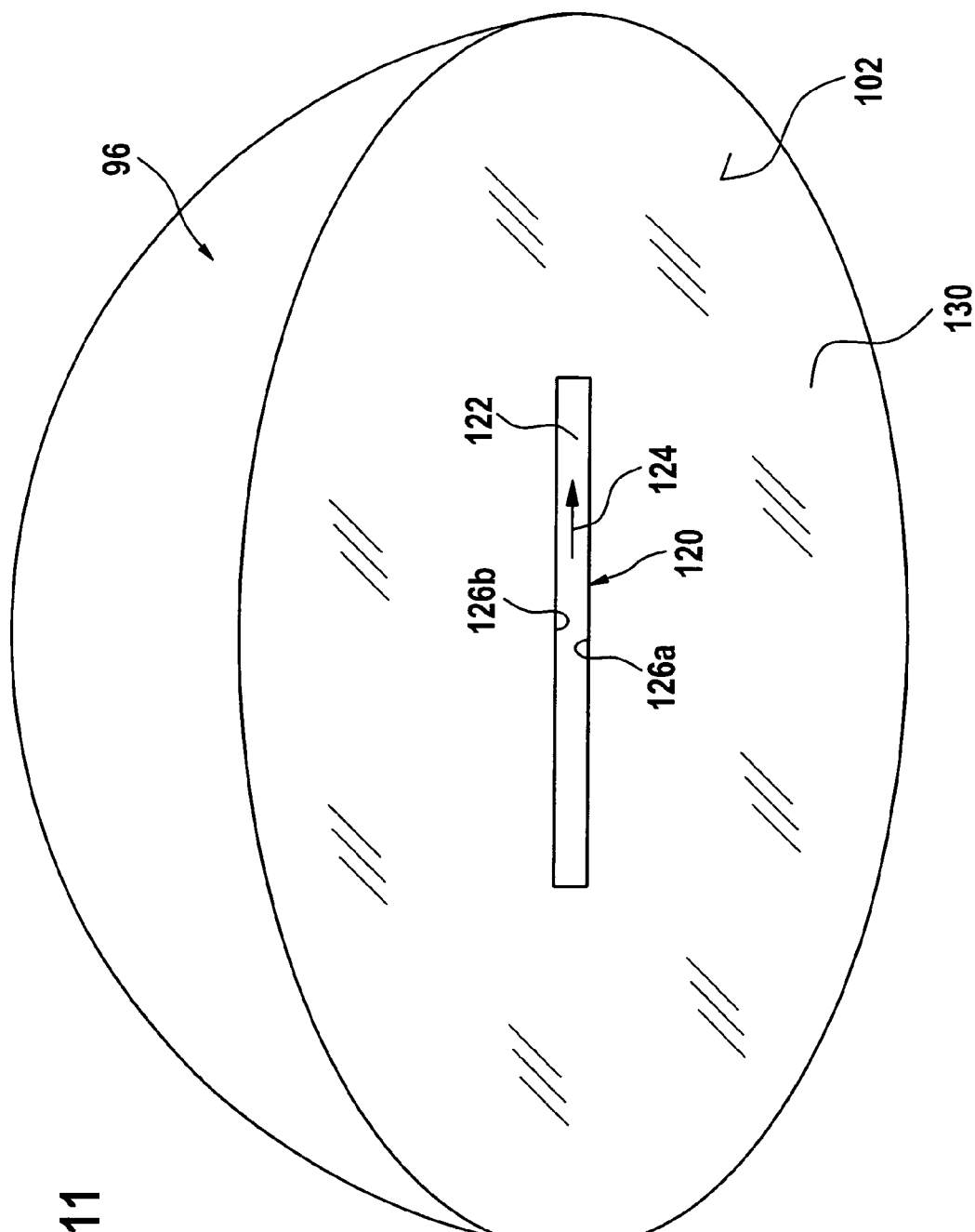
FIG. 11 shows an illustration of the arrangement of the diaphragm structure in the second embodiment of the exposure unit according to the invention on an end surface of the end lens.
Figure 12:
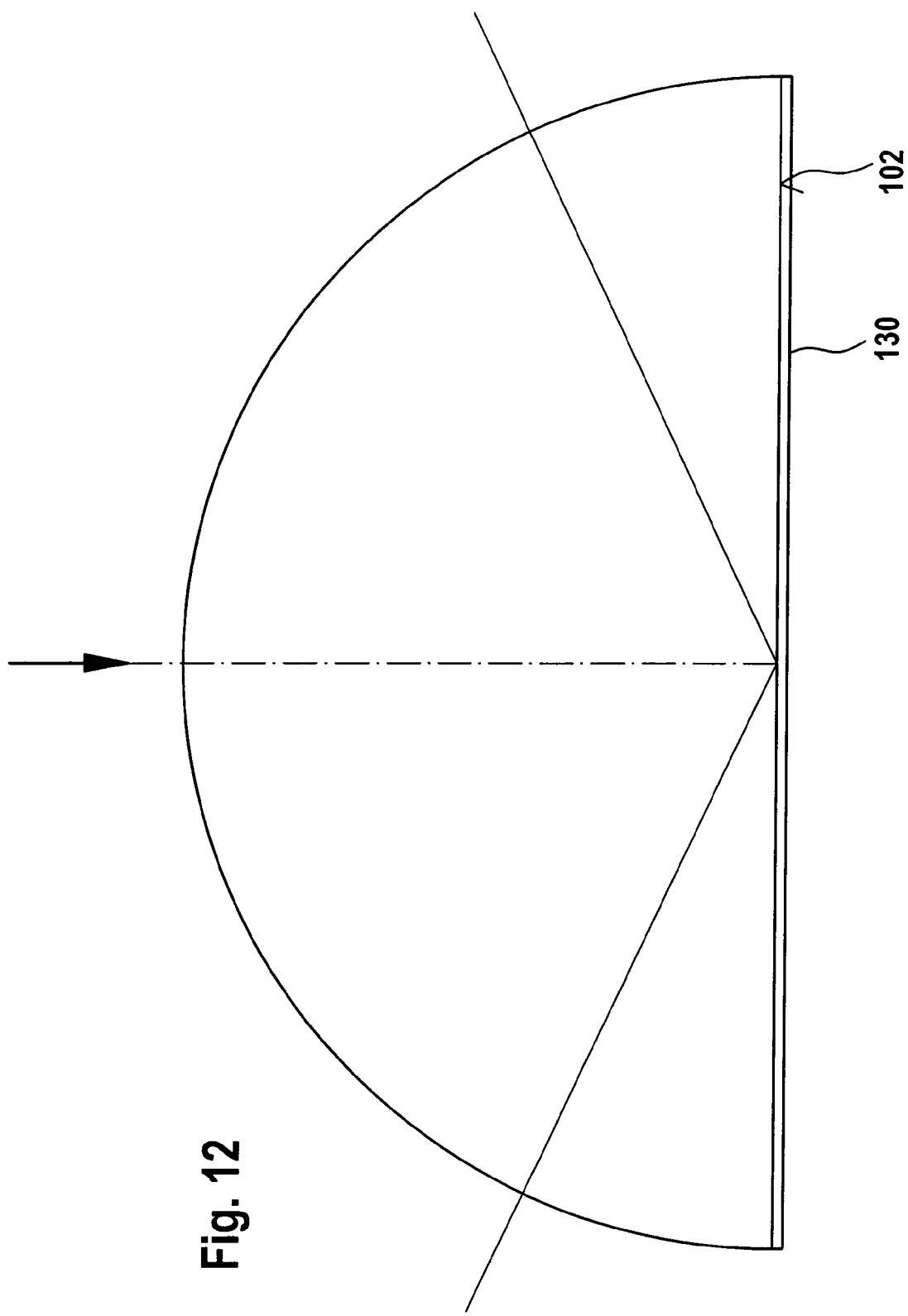
FIG. 12 shows an illustration similar to FIG. 6 of the second embodiment.

In this case, as illustrated in FIG. 10, the diameter a extends at right angles to the longitudinal side edges 126a, 126b and the diameter b parallel to the longitudinal side edges 126a, 126b of the opening 122.

The exiting laser radiation field 104 therefore has in the transverse direction 125 an extension which corresponds to the distance Ab between the longitudinal side edges 126a and 126b and in the longitudinal direction 124 an extension which corresponds to the diameter b of the distribution of intensity 116 since the diaphragm structure is not effective in this direction.

The distance Ab between the longitudinal side edges 126a, 126b is preferably selected such that it corresponds approximately to the diameter b of the distribution of intensity 116 and, therefore, the resulting focal spot 30 has altogether approximately the same extension in every direction in a plane extending at right angles to the direction of propagation 99.

If the diaphragm structure 120 has an opening 122 which is essentially of the same width over the entire longitudinal direction 124, the laser radiation field 104 passes through at every point along the longitudinal direction 124 with the same intensity for as long as the alignment of the electric field E at right angles to the longitudinal side edges 126a, 126b does not change. If the alignment of the electric field E is turned out of the position at right angles to the longitudinal side edges 126a, 126b and forms an angle of smaller than 90° with the longitudinal side edges 126a, 126b, the intensity is reduced since only the part of the laser radiation with an electric field at right angles to the longitudinal side edges 126a, 126b which results due to vectorial resolution then passes through the opening 122.

In the case of an alignment of the electric field E parallel to the longitudinal side edges 126a, 126b, essentially no field 104 passes through the opening 122.

A diaphragm structure 120 of this type with the opening 122 may preferably be applied to the end surface 102 of the end lens 96, for example, by way of evaporation coating of a film, for example, a metal film 130 which does not cover the opening 122 and in the first embodiment is applied directly to the end surface 102.

The diaphragm structure 120 may have such an extension in its longitudinal direction 124 that this acts in a limiting manner for the focal points of the laser radiation 40 of several laser radiation sources 26.

The longitudinal direction 124 must extend parallel to the direction of deflection 44 so that each exposure spot 30 generated within one of the strip areas 52 is limited in the same way by the diaphragm structure 120.

Alternatively thereto, it is, however, also conceivable to provide a separate diaphragm structure 120 for the laser radiation field 104 of each of the individual laser radiation sources 26.

With the solution according to the invention, the diaphragm structures 120 are conceived such that the distance Ab between the longitudinal side edges 126a, 126b is in the dimension of less than 400 nanometers in the case of blue laser radiation and so the exposure spots 30 also have approximately corresponding dimensions. Dimensions of the exposure spots 30 with a diameter in each direction of less than 400 nanometers can therefore be achieved, even better at the most 200 nanometers, and so highly resolved, exposed structures in the submicrometer range can be produced with the lithography exposure device according to the invention.

Figure 13:
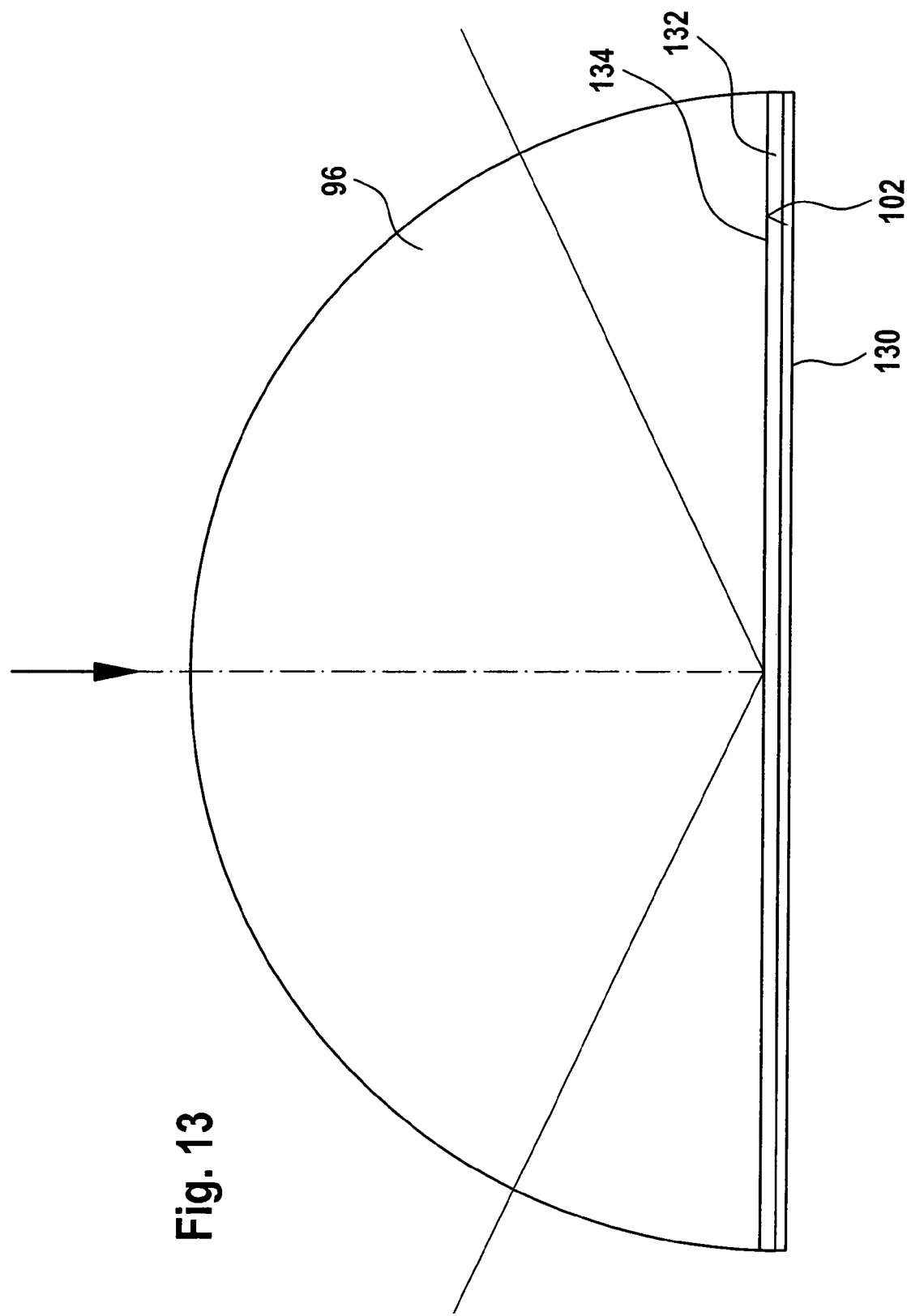
FIG. 13 shows an illustration similar to FIG. 6 of a third embodiment.

Alternatively to the second embodiment, the coating 130 forming the diaphragm structure 120 need not be applied directly to the end surface 102 of the end lens 96 in a third embodiment, illustrated in FIG. 13, but rather it is arranged on a carrier 132 which abuts, for its part, with a flat side 134 on the end surface 102 of the end lens 96 and is connected to it in a manner adapted with respect to the index of refraction.

Such a connection with adaptation of the indices of refraction between the end lens 96 and the carrier 132 is brought about, for example, by way of connection of the carrier 132 to the end lens 96 by means of bonding, blowing together or adhesion, in particular such that a refractive index gradient between the material of the end lens 96 and the material of the carrier 132 is avoided.

Figure 14:
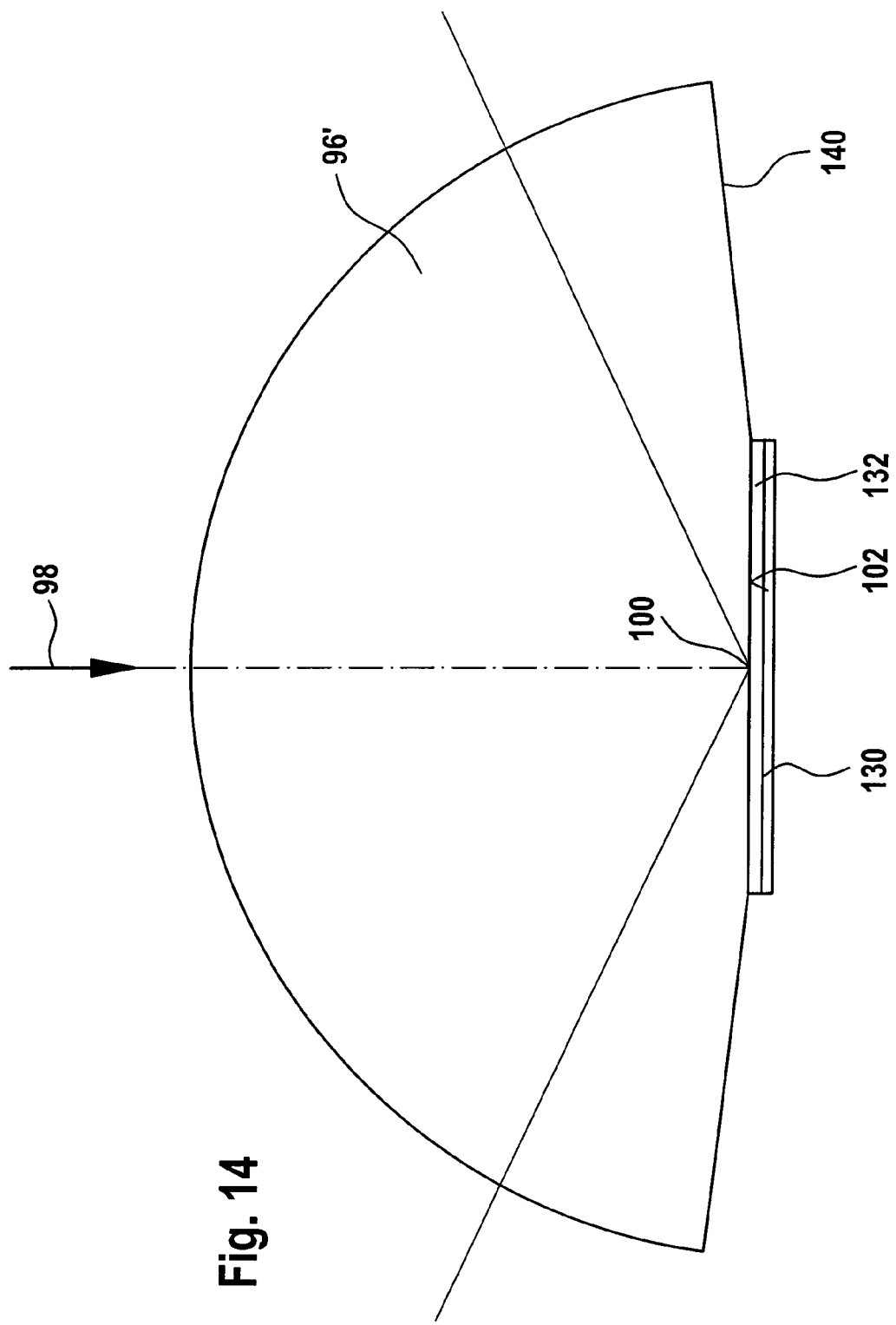
FIG. 14 shows an illustration similar to FIG. 6 of a fourth embodiment.

In a fourth embodiment, illustrated in FIG. 14, the end surface 102 of the end lens 96' extends only in a central area thereof, namely in the area, in which the focal points 100 are located, whereas the end lens 96' is set back in relation to the end surface 102 in its outer areas 140 facing the light-sensitive layer 32 and surrounding the end surfaces 102 and, therefore, is at a greater distance from the light-sensitive layer 32.

In this case, the carrier 132 is also designed such that it abuts only on the end surface 102 of the end lens 96' and is connected to it in a manner adapted with respect to the index of refraction, as described.

Figure 15:
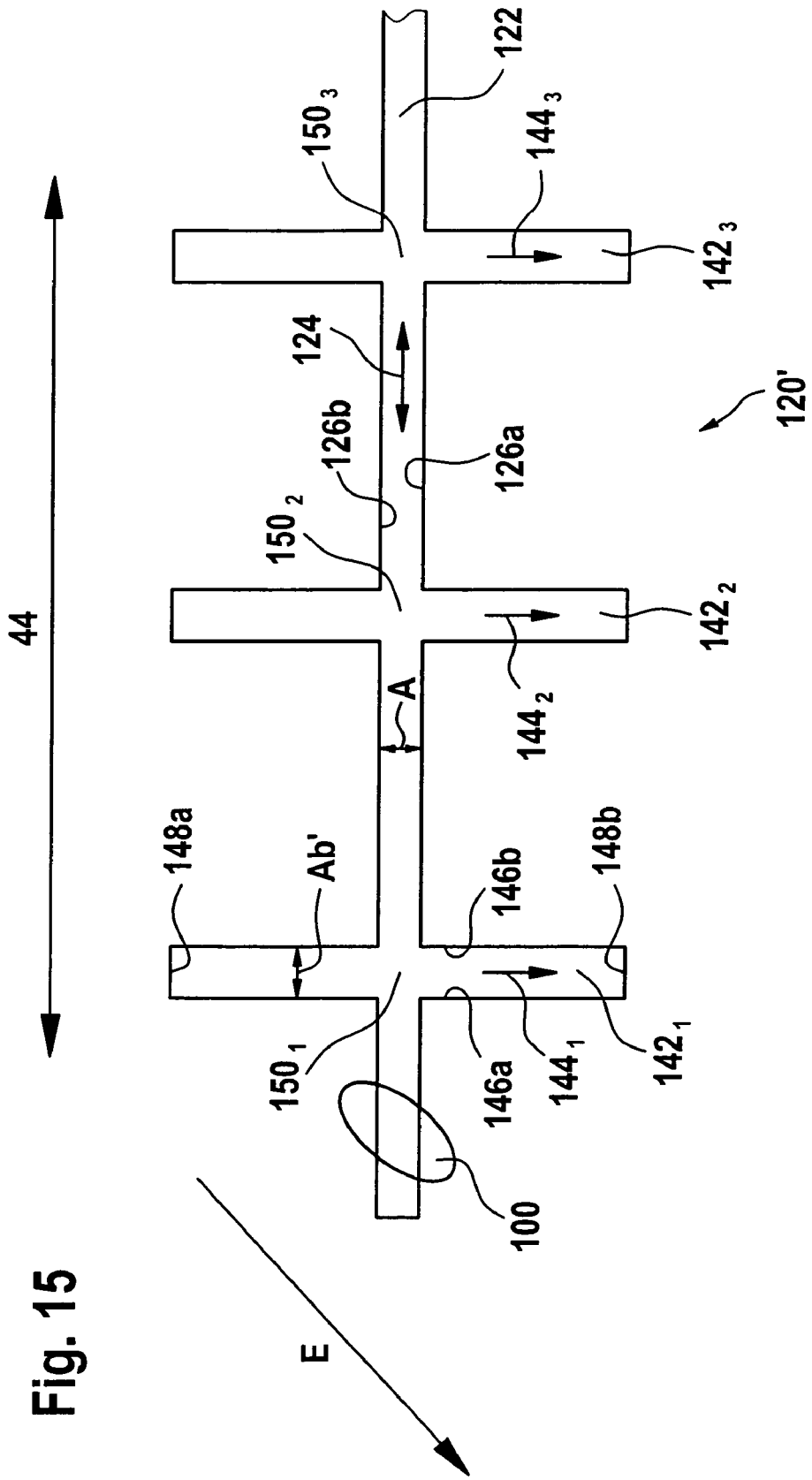
FIG. 15 shows an illustration similar to FIG. 10 of a fifth embodiment of the exposure unit according to the invention and FIG. 16 shows an illustration similar to FIG. 10 of a sixth embodiment of the exposure unit according to the invention.

In a fifth embodiment, illustrated in FIG. 15, the diaphragm structure 120' is constructed such that it comprises, in addition to the opening 122 extending in the longitudinal direction 124, openings $142_1$, $142_2$ and $142_3$ which intersect it or, where applicable, even more of such intersecting openings 142 which extend at right angles to the longitudinal direction 124 with their longitudinal direction $144_1$, $144_2$ and $144_3$ and have longitudinal side edges 146a and 146b which likewise extend at a distance Ab' from one another corresponding approximately to the distance Ab while transverse side edges 148a, 148b likewise have a distance from one another which is considerably greater than the wavelength.

Intersecting areas $150_1$, $150_2$ and $150_3$ therefore result between the opening 122 and the openings 142.

If the electric field E of the laser radiation field 104 is now aligned such that it extends at an angle of 45° in relation to the longitudinal direction 124 and to the longitudinal directions 144 and if the direction of deflection 44 extends parallel to the longitudinal direction 124, the intensity of the laser radiation field 104 proceeding from a focal point 100 is approximately half the maximum intensity for as long as the focal point moves over an area of the opening 122 outside the intersecting areas 150 since, on account of vectorial resolution, the electric field E has at right angles to the longitudinal direction 124 a component which leads to half the intensity passing through the opening 122.

If the focal point 100 does, however, reach one of the intersecting areas 150, half the intensity then passes each time not only through the opening 122 but also the respective opening 142 and so the maximum intensity of the laser radiation field 104 passing through the diaphragm structure 120' can be reached in the region of the respective intersecting area 150.

In this respect, if the sensitivity of the light-sensitive layer 132 can be adjusted such that at half the maximum intensity of the laser radiation field 104 no conversion takes place, an exposure spot 30, which converts the light-sensitive layer within the conversion area 34, can be generated only at the intersecting areas 150.

Figure 16:
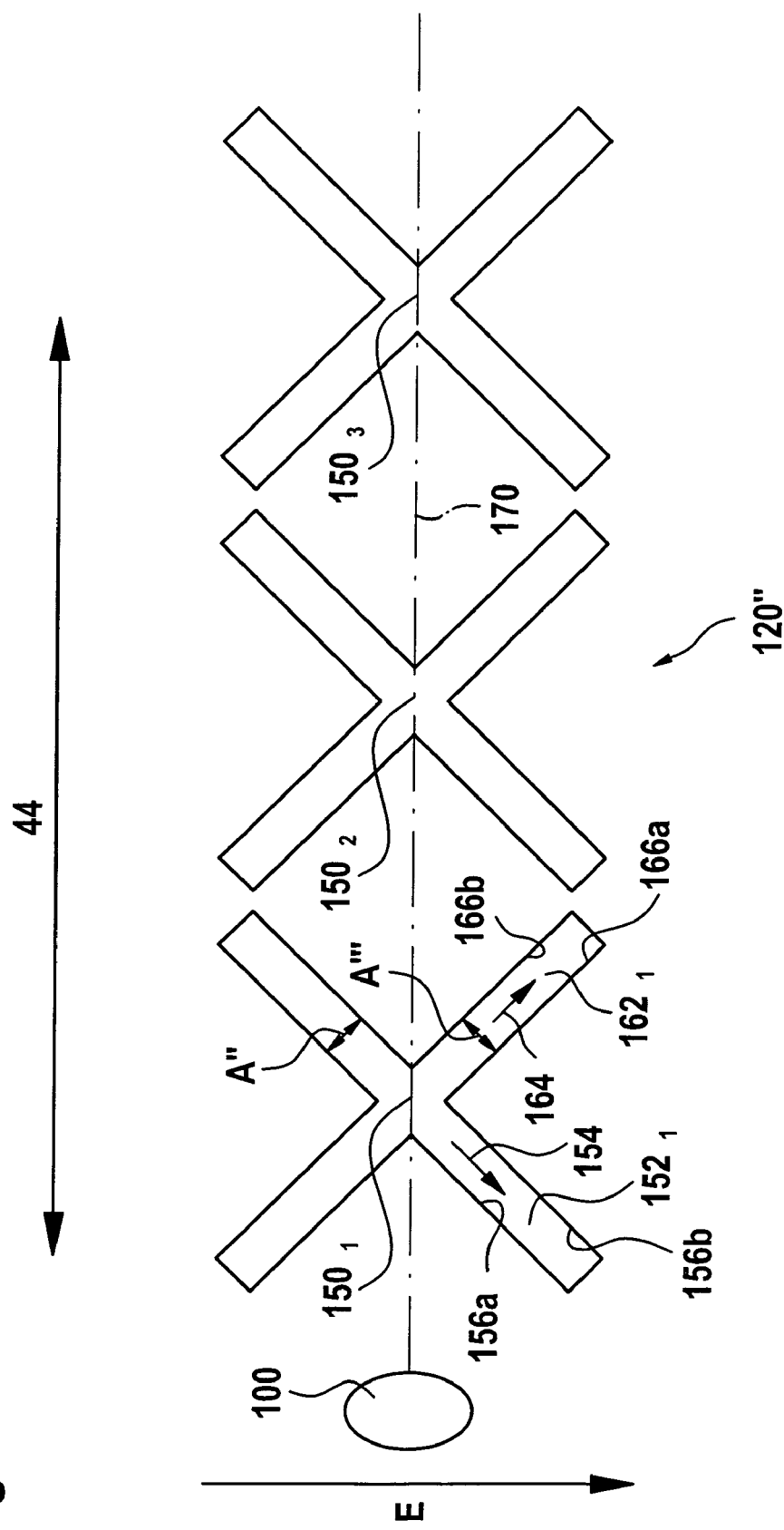

In a sixth embodiment, illustrated in FIG. 16, the diaphragm structure 120" is likewise designed such that it comprises intersecting areas 150 which are arranged so as to follow one another in the direction of deflection 44.

These intersecting areas are, however, formed by elongated openings 152, 162 which extend at right angles to one another with their longitudinal directions 154, 164 and have longitudinal side edges 156a, b as well as 166a, b which are arranged at a distance Ab" and Ab''', respectively, from one another which, as in the preceding embodiments, is smaller than the wavelength R of the laser radiation 98. Since the longitudinal directions 154 and 164 each extend at an angle of 45° in relation to the direction of deflection, the movement of a focal point 100, the electric field E of which is aligned at right angles to the direction of deflection 44, on a path 170 intersecting the intersecting areas 150 results in the focal point 100 being arranged each time so as to cover the openings 152, 162 only in the intersecting areas 150 and, therefore, the field 104, the intensity of which corresponds to the maximum intensity, can form only when the focal point 100 is located over the respective intersecting areas 150, as explained in conjunction with the intersecting areas 150 in the fifth embodiment.

As a result, exposure spots 30, which also lead in the light-sensitive layer to a corresponding conversion thereof within a respective conversion area 34, can be generated on the light-sensitive layer 32 only in the area of the openings 150.

The invention claimed is:

1. Lithography exposure device for producing exposed structures extending in a surface area in a light sensitive layer, comprising:

a mounting device for the light-sensitive layer, an exposure unit comprising several laser radiation sources, an optical focusing means associated with the laser radiation sources for focusing laser radiation exiting from the respective laser radiation sources, said optical focusing means generating from the laser radiation of each of the laser radiation sources an exposure spot effective in the light-sensitive layer with a predetermined extension transverse to a direction of exposure movement, a movement unit for generating a relative movement between the optical focusing means and the mounting device in the direction of exposure movement, and a control for controlling intensity and position of the exposure spots relative to the light-sensitive layer in such a manner that a plurality of conversion areas penetrating the light-sensitive layer are generatable by means of the exposure spots, a material of the light-sensitive layer being converted in said areas from an initial state into the exposed state, and said areas together resulting in an exposed structure, the optical focusing means having an end lens generating focal points of the laser radiation exiting from each of the laser radiation sources close to the light-sensitive layer, and a laser radiation field propagating in a direction of the light sensitive layer for generating each of the exposure spots from the respective focal points and having a power density leading in the conversion area in the light-sensitive layer to an elongated longitudinal channel extending in the direction of propagation of the radiation field through the light sensitive layer, said channel being formed by a Kerr effect induced change in an index of refraction, which channel penetrates the light-sensitive layer with the index of refraction increased in relation to the channel's surroundings and guides the respective laser radiation field in a spatially limited manner, the channel having, transversely to the direction of propagation, a cross sectional surface area corresponding at most to an extension of the corresponding exposure spot on a surface of the light sensitive layer facing the lens.

2. Lithography exposure device as defined in claim 1, wherein the respective laser radiation field is formed by short pulses with excessive power.

3. Lithography exposure device as defined in claim 2, wherein the short pulses have a pulse duration in a range of a few nanoseconds or shorter.

4. Lithography exposure device as defined in claim 1, wherein the Kerr effect leads in the channel to an increase in the index of refraction in relation to surroundings in the light-sensitive layer by more than 0.1.

5. Lithography exposure device as defined in claim 1, wherein the focal points are located in a solid-state body of the end lens and in an area bordering on its end surface.

6. Lithography exposure device as defined in claim 1, wherein the end lens is arranged with its end surface at a distance from the light-sensitive layer smaller than half a length of a light wave of the laser radiation in a vacuum.

7. Lithography exposure device as defined in claim 6, wherein the distance is less than approximately 50 nanometers.

8. Lithography exposure device as defined in claim 1, wherein the light-sensitive layer is a photosensitive coating layer.

9. Lithography exposure device as defined in claim 1, wherein each exposure spot is movable in a direction of deflection extending transversely to the direction of exposure movement.

10. Lithography exposure device as defined in claim 1, wherein the cross-sectional surface area of the longitudinal channel corresponds at most to an extension of the corresponding focal point in an end surface of the lens.

11. Lithography exposure device for producing exposed structures extending in a surface area in a light sensitive layer, comprising:

a mounting device for the light-sensitive layer, an exposure unit comprising several laser radiation sources, an optical focusing means associated with the laser radiation sources for focusing laser radiation exiting from the respective laser radiation sources, said optical focusing means generating from the laser radiation of each of the laser radiation sources an exposure spot effective in the light-sensitive layer with a predetermined extension transverse to a direction of exposure movement, a movement unit for generating a relative movement between the optical focusing means and the mounting device in the direction of exposure movement, and a control for controlling intensity and position of the exposure spots relative to the light-sensitive layer in such a manner that a plurality of conversion areas penetrating the light-sensitive layer are generatable by means of the exposure spots, a material of the light-sensitive layer being converted in said areas from an initial state into the exposed state, and said areas together resulting in an exposed structure, the optical focusing means having an end lens generating focal points of the laser radiation exiting from each of the laser radiation sources close to the light-sensitive layer, and a laser radiation field propagating in a direction of the light sensitive layer for generating each of the exposure spots from the respective focal points and having a power density leading in the conversion area in the light-sensitive layer to a longitudinal channel formed by a Kerr effect induced change in an index of refraction, which channel penetrates the light-sensitive layer with the index of refraction increased in relation to the channel's surroundings and guides the respective laser radiation field in a spatially limited manner, wherein the power density of the laser radiation field in the conversion area is in a range of approximately $10^6$ to approximately $10^8$ W/cm$^2$.

12. Lithography exposure device as defined in claim 11, wherein the channel has, transversely to the direction of propagation, a cross sectional surface area corresponding at most to an extension of the corresponding focal point in an end surface of the lens.

13. Lithography exposure device for producing exposed structures extending in a surface area in a light sensitive layer, comprising:

a mounting device for the light-sensitive layer, an exposure unit comprising several laser radiation sources, an optical focusing means associated with the laser radiation sources for focusing laser radiation exiting from the respective laser radiation sources, said optical focusing means generating from the laser radiation of each of the laser radiation sources an exposure spot effective in the light-sensitive layer with a predetermined extension transverse to a direction of exposure movement, a movement unit for generating a relative movement between the optical focusing means and the mounting device in the direction of exposure movement, and a control for controlling intensity and position of the exposure spots relative to the light-sensitive layer in such a manner that a plurality of conversion areas penetrating the light-sensitive layer are generatable by means of the exposure spots, a material of the light-sensitive layer being converted in said areas from an initial state into the exposed state, and said areas together resulting in an exposed structure, the optical focusing means having an end lens generating focal points of the laser radiation exiting from each of the laser radiation sources close to the light-sensitive layer, and a laser radiation field propagating in a direction of the light sensitive layer for generating each of the exposure spots from the respective focal points and having a power density leading in the conversion area in the light-sensitive layer to a longitudinal channel formed by an increase in an index of refraction in relation to surroundings in the light-sensitive layer by more than 0.1 induced solely by the Kerr effect, which channel penetrates the light-sensitive layer with the index of refraction increased in relation to the channel's surroundings and guides the respective laser radiation field in a spatially limited manner.

14. Lithography exposure device for producing exposed structures extending in a surface area in a light sensitive layer, comprising:

a mounting device for the light-sensitive layer, an exposure unit comprising several laser radiation sources, an optical focusing means associated with the laser radiation sources for focusing laser radiation exiting from the respective laser radiation sources, said optical focusing means generating from the laser radiation of each of the laser radiation sources an exposure spot effective in the light-sensitive layer with a predetermined extension transverse to a direction of exposure movement, a movement unit for generating a relative movement between the optical focusing means and the mounting device in the direction of exposure movement, and a control for controlling intensity and position of the exposure spots relative to the light-sensitive layer in such a manner that a plurality of conversion areas penetrating the light-sensitive layer are generatable by means of the exposure spots, a material of the light-sensitive layer being converted in said areas from an initial state into the exposed state, and said areas together resulting in an exposed structure, the optical focusing means having an end lens generating focal points of the laser radiation exiting from each of the laser radiation sources close to the light-sensitive layer, and a laser radiation field propagating in a direction of the light sensitive layer for generating each of the exposure spots from the respective focal points and having a power density leading in the conversion area in the light-sensitive layer to a longitudinal channel formed by a Kerr effect induced change in an index of refraction, which channel has an essentially constant cross-section extending in the direction of propagation of the radiation field and penetrates the light-sensitive layer with the index of refraction increased in relation to the channel's surroundings and guides the respective laser radiation field in a spatially limited manner.

* * * * *